(12) United States Patent
Tanaka et al.

(10) Patent No.: US 7,107,669 B2
(45) Date of Patent: Sep. 19, 2006

(54) SYSTEM FOR MOUNTING AN UNDERFLOOR ELECTRONIC EQUIPMENT

(75) Inventors: Takeshi Tanaka, Hitachinaka (JP); Nobuaki Mizuguchi, Hitachinaka (JP); Seijiro Todori, Hikari (JP); Shinya Mitsudomi, Noda (JP); Yoshihiko Ina, Kudamatsu (JP); Syu Nakaigawa, Hitachinaka (JP)

(73) Assignee: Hitachi, Ltd., Tokyo (JP)

( * ) Notice: Subject to any disclaimer, the term of this patent is extended or adjusted under 35 U.S.C. 154(b) by 440 days.

(21) Appl. No.: 10/352,990

(22) Filed: Jan. 29, 2003

(65) Prior Publication Data

US 2004/0143961 A1    Jul. 29, 2004

(51) Int. Cl.
*B23P 19/00* (2006.01)
*B61D 17/04* (2006.01)

(52) U.S. Cl. ............... 29/729; 29/737; 29/739; 29/748; 29/757; 105/238.1

(58) Field of Classification Search .............. 29/729, 29/739, 748, 876, 746, 758, 757; 361/726, 361/727, 683, 679, 681, 684; 105/238.1
See application file for complete search history.

(56) References Cited

U.S. PATENT DOCUMENTS 4,084,865 A * 4/1978 Joyce ................ 312/111
4,853,830 A * 8/1989 Corfits et al. .......... 361/725
5,912,799 A * 6/1999 Grouell et al. .......... 361/685
6,018,456 A * 1/2000 Young et al. ........... 361/684

* cited by examiner

*Primary Examiner*—A. Dexter Tugbang
*Assistant Examiner*—Tai Nguyen
(74) *Attorney, Agent, or Firm*—Antonelli, Terry, Stout and Kraus, LLP.

(57) ABSTRACT

This invention relates to a system for mounting an underfloor electronic equipment to a rolling stock body having an underfloor storage portion formed under the floor in the longitudinal direction of the body as a portion of the body. The underfloor storage portion comprises a guidance tool for guiding and supporting the underfloor electronic equipment formed as a unit, a body-side connector corresponding to an electronic equipment-side connector formed to the electronic equipment, and a fixing tool for fixing the electronic equipment to the underfloor storage portion. The underfloor electronic equipment comprises a moving means guided by the guidance tool and the electronic equipment-side connector corresponding to the body-side connector. The electronic equipment can be moved by the guidance tool between a fixing position within the storage portion and a removal position outside the storage portion, the fixing tool used to fix the equipment to the fixing position where the equipment is electrically connected. The present invention facilitates maintenance and replacement of the electronic equipments and shortens operation time.

9 Claims, 6 Drawing Sheets

000# SYSTEM FOR MOUNTING AN UNDERFLOOR ELECTRONIC EQUIPMENT

FIELD OF THE INVENTION

The present invention relates to a rolling stock (railcar), and more specifically, to a system for mounting underfloor electronic equipments to the rolling stock. It relates to a mounting system for providing under the floor of the rolling stock body a storage portion for storing underfloor electronic equipments, especially semiconductor devices such as inverter units and static inverter units, the storage portion formed integrally with the body.

DESCRIPTION OF THE RELATED ART

As shown in FIG. 6, according to a prior art system for mounting underfloor electronic equipments to a rolling stock, underfloor electronic equipments such as a power unit 11' constituting an inverter unit, a control unit 21', and an oil filter capacitor 22' are stored and fixed to an electronic equipment storage box 9 which is mounted under the floor of a rolling stock body 5, and thereafter, the underfloor electronic equipments are connected with the wiring provided to the body.

The drawback of such electronic equipment mounting system is that various electronic equipment storage boxes exist in a scattered manner under the floor of the body, and at the time of maintenance of the electronic equipments, the operator must move back and forth between the outer side and the inner area of the body to disconnect the electrical connections between the electronic equipments stored in the storage box and the wiring provided to the body before removing the electronic equipments, and when necessary, the operator must remove the storage box storing the electronic equipments from the underfloor portion of the body. Thus, the conventional maintenance process requires many steps.

SUMMARY OF THE INVENTION

The present invention aims at solving the problems of the prior art.

The object of the present invention is to reduce the number of steps related to mounting various electronic equipments to the rolling stock body and to reduce the cost related to manufacturing the body itself.

Another object of the present invention is to enable maintenance of the underfloor electronic equipment by accessing the equipment from only one side thereof, thus facilitating the replacement and maintenance of the electronic equipments (such as a power unit of an inverter) and cutting down operation time.

In order to solve the above problems, the present invention provides a system for mounting an electronic equipment to be mounted under a floor of a rolling stock body (hereinafter called underfloor electronic equipment) to a rolling stock body having an underfloor storage portion formed in a longitudinal direction of an underfloor of the rolling stock body as a portion of the body, the underfloor storage portion comprising:

a guidance tool for carrying out guidance and support of the underfloor electronic equipment formed as a unit;

a connector formed to the rolling stock body (hereinafter called body-side connector) corresponding to an electronic equipment-side connector equipped to the underfloor electronic equipment; and a fixing tool for fixing the underfloor electronic equipment to the underfloor storage portion;

the underfloor electronic equipment comprising:

a moving means guided by the guidance tool provided to the underfloor storage portion; and the electronic equipment-side connector corresponding to the body-side connector;

the underfloor electronic equipment capable of being moved by the guidance tool between a fixed position within the underfloor storage portion and a removal position outside the underfloor storage portion, the equipment being stored and fixed to the fixed position within the underfloor storage portion by a fixing means, the electronic equipment-side connector and the body-side connector being connected when the underfloor electronic equipment is at the fixed position.

According to the above system for mounting an underfloor electronic equipment to a rolling stock body, the underfloor storage portion desirably comprises an electronic equipment insertion opening through which the electronic equipment can pass formed to an outer side of the body, and a cover for covering the electronic equipment insertion opening that is mounted so that it can be either attached/detached or opened/closed.

According to the above system for mounting an underfloor electronic equipment to a rolling stock body, the cover that covers the electronic equipment insertion opening when fixing the electronic equipment to the fixed position within the underfloor storage unit is mounted integrally to the electronic equipment, and the electronic equipment is immovably fixed to the fixed position within the underfloor storage portion by fixing the cover.

According to the above system for mounting an underfloor electronic equipment to a rolling stock body, the underfloor storage portion comprises a cooling opening formed to a side facing the center of the body through which is exposed a portion of the electronic equipment. The portion of the electronic equipment being exposed is positioned in a released room that is communicated with outside air, and the remaining portion of the electronic equipment is stored within a sealed room that shuts off the outside air.

According further to the above system for mounting an underfloor electronic equipment to a rolling stock body, the body-side connector is located so that the electronic equipment-side connector is connected to the body-side connector when the electronic equipment is fixed to the fixed position within the underfloor storage portion.

According to the present system for mounting an underfloor electronic equipment to a rolling stock body, the guidance tool provided to the underfloor storage portion and the moving means provided to the electronic equipment are composed of sliding rails.

According to the present system for mounting an underfloor electronic equipment to a rolling stock body, the guidance tool formed to the underfloor storage portion is a support rail formed to the interior of the underfloor storage portion, and the moving means provided to the electronic equipment are wheels guided by the support rail.

According to the present system for mounting an underfloor electronic equipment to a rolling stock body, the underfloor electronic equipment is a semiconductor device, and desirably, the semiconductor device is a power unit of an inverter unit that is modularized to include the parts that need to be replaced often.

According further to the present system for mounting an underfloor electronic equipment to a rolling stock body arranged so that when the electronic equipment is fixed to the fixed position within the underfloor storage portion the electronic equipment-side connector is connected to the body-side connector, the body-side connector is formed as an integral structure with a plurality of other body-side connectors that connect to a plurality of electronic equipments, the body-side connector designed so that it can be removed from one side of the underfloor storage portion.

The present invention also provides an underfloor electronic equipment to be mounted on a rolling stock body with an underfloor storage portion formed under a floor in a longitudinal direction of the body as a portion of a body, the underfloor electronic equipment comprising:

a modularized power unit;

a frame body in which is mounted the power unit;

a moving means fixed to the frame body and guided by a guidance tool provided to the underfloor storage portion; and an electronic equipment-side connector that corresponds to a body-side connector provided to the underfloor storage portion.

The present invention further provides an underfloor electronic equipment for a rolling stock body to which is applied a system for mounting an underfloor electronic equipment to a rolling stock body; the mounting system being a system for mounting an underfloor electronic equipment to a rolling stock body with an underfloor storage portion formed under a floor in a longitudinal direction of the body as a portion of the body; the underfloor storage portion comprising a guidance tool for guiding and supporting the underfloor electronic equipment formed as a unit, a body-side connector corresponding to an electronic equipment-side connector provided to the underfloor electronic equipment and a fixing tool for fixing the underfloor electronic equipment to the underfloor storage portion; the underfloor electronic equipment comprising a moving means guided by a guidance tool provided to the underfloor storage portion and an electronic equipment-side connector corresponding to the body-side connector, the underfloor electronic equipment being moved between a fixed position of the underfloor storage portion and a removal position outside the underfloor storage portion by the guidance tool, the underfloor electronic equipment being stored and fixed by the fixing tool to the fixed position within the underfloor storage portion, the electronic equipment-side connector being connected to the body-side connector at the fixed position;

the underfloor electronic equipment further comprising a moving means to be guided by the guidance tool provided to the underfloor storage portion; and an electronic equipment-side connector fixed to a position corresponding to the body-side connector.

Furthermore, the present invention provides a rolling stock body to which is applied a system for mounting an underfloor electronic equipment to a rolling stock body with an underfloor storage portion formed under a floor in a longitudinal direction of the body as a portion of the body; according to the mounting system, the underfloor storage portion comprising a guidance tool for guiding and supporting the underfloor electronic equipment formed as a unit, a body-side connector corresponding to an electronic equipment-side connector provided to the underfloor electronic equipment and a fixing tool for fixing the underfloor electronic equipment to the underfloor storage portion; the underfloor electronic equipment comprising a moving means guided by a guidance tool provided to the underfloor storage portion and an electronic equipment-side connector corresponding to the body-side connector, the underfloor electronic equipment being moved between a fixed position of the underfloor storage portion and a removal position outside the underfloor storage portion by the guidance tool, the underfloor electronic equipment being stored and fixed by the fixing tool to the fixed position within the underfloor storage portion, the electronic equipment-side connector being connected to the body-side connector at the fixed position;

the underfloor storage portion being formed under a floor in the longitudinal direction of the body as a portion of the body, comprising the guidance tool for guiding and supporting the underfloor electronic equipment formed as a unit;

the body-side connector corresponding to the electronic equipment-side connector provided to the underfloor electronic equipment;

the fixing means for fixing the underfloor electronic equipment to the underfloor storage portion;

an electronic equipment insertion opening formed to the outer surface of the body through which the electronic equipment can pass; and an opening formed to a side surface facing a center of the body through which a portion of the electronic equipment is exposed.

BRIEF DESCRIPTION OF THE DRAWINGS

A mounting system for mounting an underfloor electronic equipment to a rolling stock body according to the present invention will be explained with reference to the accompanied drawings. In the drawing.

DETAILED DESCRIPTION OF THE PREFERRED EMBODIMENTS

Figure 1:
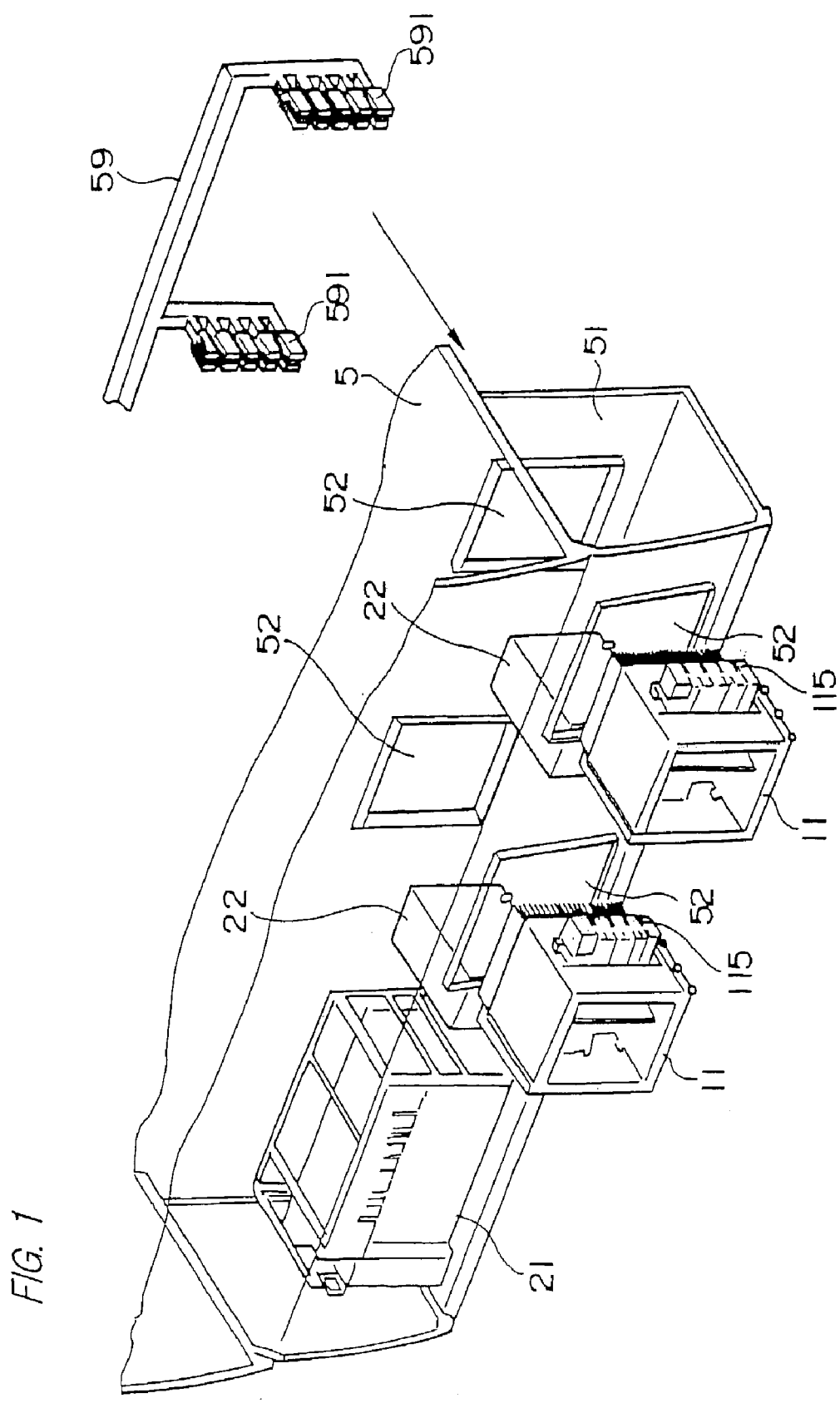
FIG. 1 is an explanatory partial perspective view showing an example of mounting as an underfloor electronic equipment a semiconductor device, actually a power unit of an inverter device, to a mounting portion formed integrally as a part of a rolling stock body under the floor of the body.

As shown in FIG. 1, the method for mounting an underfloor electronic equipment to a rolling stock body relates to a method for storing and fixing an underfloor electronic equipment such as a power unit 11 constituting an inverter device, a control unit 21 and a filter capacitor 22 to an underfloor storage portion 51 formed to the area under the floor of a rolling stock body 5.

The underfloor storage portion 51 is formed integrally with the body 5, positioned under the floor of the body along the longitudinal direction of the body. The function of the underfloor storage portion is to store in its inner space the underfloor electronic equipments, and to increase the rigidity of the body.

The underfloor storage portion 51 has on its outer-side surface an electronic equipment insertion opening 52 through which the electronic equipment passes, and further has a cooling opening 53 formed to the center-side surface through which a portion of the electronic equipment is exposed. The electronic equipment insertion opening 52 is closed by a cover 59 (FIG. 2) mounted to the opening 52 either capable of being attached and detached or opened and closed.

Figure 2:
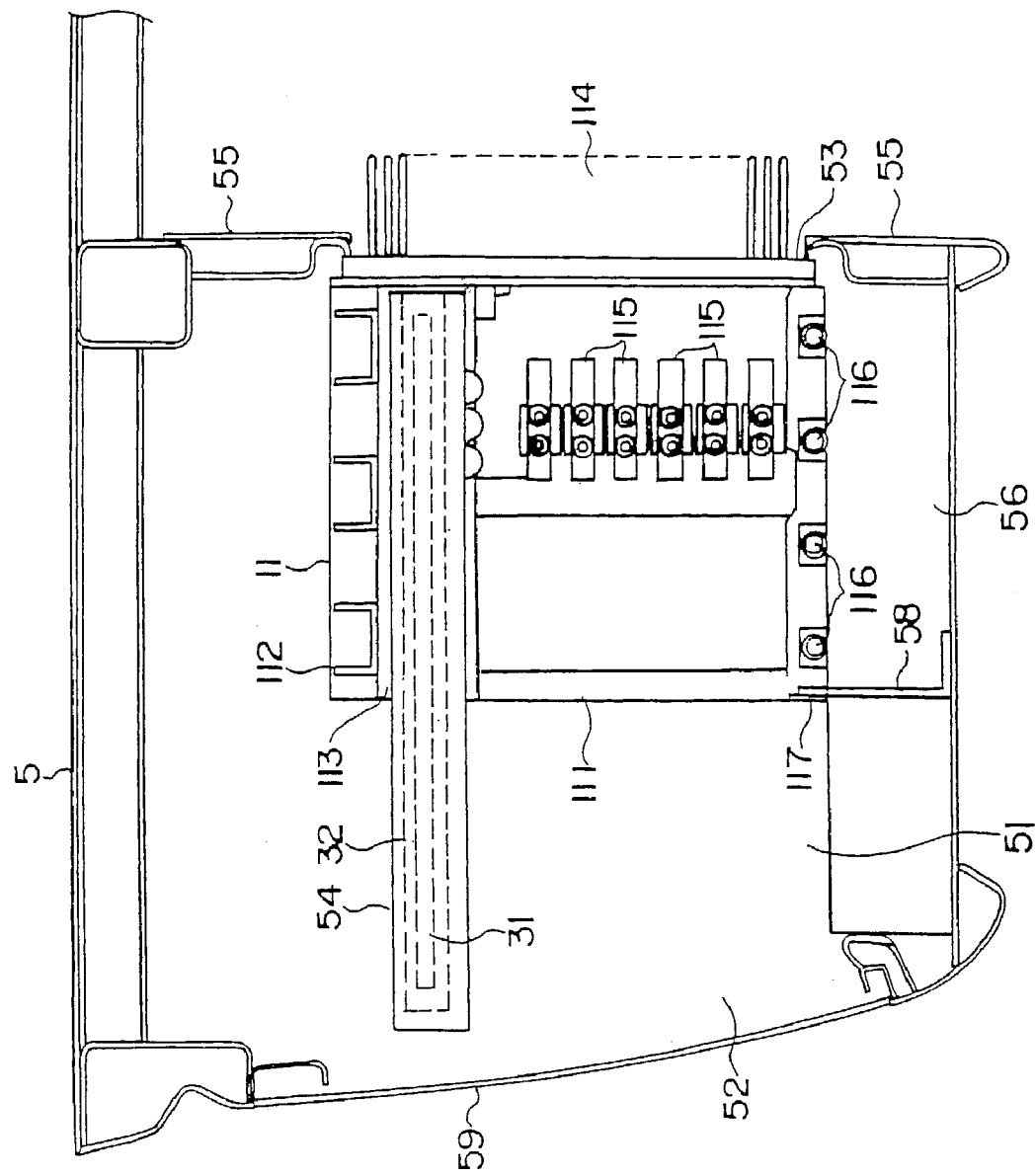
FIG. 2 is a cross-sectional view showing the mounting portion shown in FIG. 1 taken at a surface orthogonal to the longitudinal direction of the body.
Figure 3:
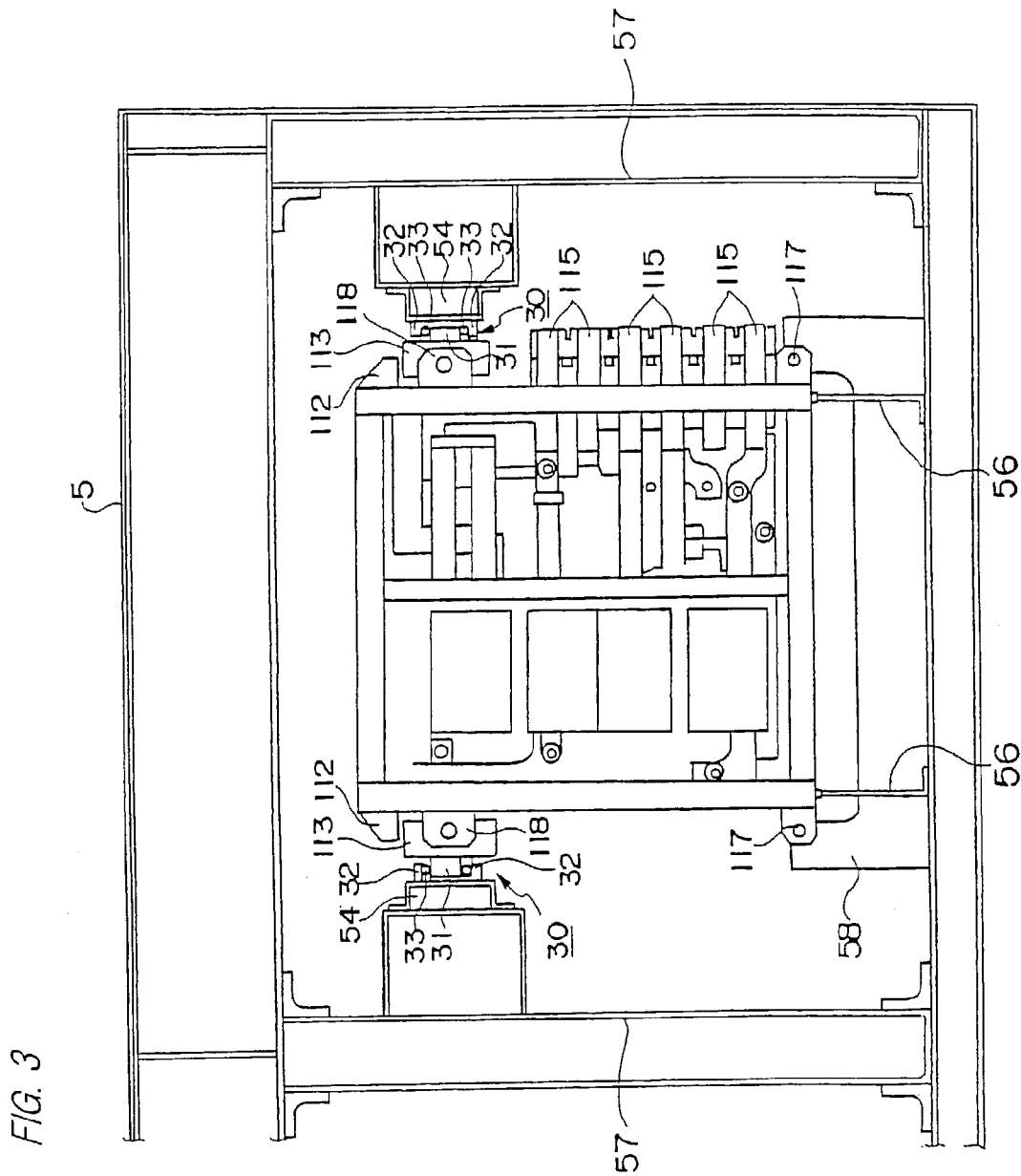
FIG. 3 is a cross-sectional view taken from the left hand side of FIG. 2.

As shown in FIGS. 2 and 3, the underfloor storage portion 51 is formed integrally to the underfloor portion of the body 5, comprising on the outer side surface of the body an electronic equipment insertion opening 52 through which the electronic equipment is introduced, and a cooling opening 53 formed to a side wall 55 facing the center of the body through which a cooling fin 114 formed to the back of the electronic equipment is exposed. The underfloor storage portion 51 is formed to the left and right sides of the underfloor area of the rolling stock body 5, the center space being used as a cooling space of the appliances, cooling being performed either by natural air cooling or by running wind.

The electronic equipment insertion opening 52 with a cover 59 can be closed in airproof and waterproof manner by a locking tool not shown.

The cooling opening 53 and the periphery of the back surface of the electronic equipment are airtightly sealed via a packing (not shown) that prevents water from entering the interior space.

A first sliding rail supporting member 54 is fixed to a separation wall 57 formed to the underfloor storage portion 51. A fix rail 32 of a sliding rail 30 (rail enabling object to slide) functioning as a guidance tool is fixed to the first sliding rail supporting member 54.

On the inner bottom surface of the underfloor storage portion 51 are fixed a rail 56 functioning as support/guidance tool and an electronic equipment fixing means 58 for fixing the electronic equipment to a fixed position. Any mechanism can be applied as the locking mechanism of the electronic equipment fixing means 58, and it is not shown in the drawing.

The power unit 11 being one example of the underfloor electronic equipment is formed by fixing electronic parts to a frame body 111, the power unit 11 comprising a support member 112, a second sliding rail support member 113, a cooling fin 114, a connector formed to the side of the electronic equipment (an electronic equipment-side connector) 115, wheels 116 functioning as moving means, a fixing member 117, and a fixing member 118.

The support member 112 supports the frame body 111 on the upper face of the second sliding rail support member 113.

The second sliding rail support member 113 is fixed to the fixing member 118 of the frame body 111, to which is engaged a moving rail 31 of the sliding rail 30.

The cooling fin 114 is equipped to the back surface of the electronic equipment for radiating the heat generated by the appliance to the cooling space.

The electronic equipment-side connector 115 includes +-terminals to be connected to a DC power supply, a three-phase AC terminal to be connected to a load of a motor etc., and an earth terminal, formed to protrude from the side surface of the power unit. The electronic equipment-side connector 115 is located so that when the power unit is arranged in the fixed position, the end of the connector 115 is inserted and connected to the receiving portion of the body-side connector 591 provided in the underfloor storage portion 51. This body-side connector 591 constitutes a portion of a harness 59 for a main control circuit that is integrally formed as a single structure with other adjacent body-side connectors 591, the harness capable of being removed from one side of the underfloor storage portion, such as from the side surface facing the center of the body, thus facilitating the mounting and connecting operation.

The wheels 116 support the power unit 11, facilitating the movement of the power unit 11 when mounting the unit to the body or removing the same therefrom, and supports the power unit 11 on the rail 56 provided to the body when the power unit 11 is fixed to position.

The fixing member 117 fixes the electronic equipment to the determined position within the underfloor storage portion 51, together with an electronic equipment fixing means 58 and utilizing a locking tool (not shown).

The fixing member 118 is for fixing the second sliding rail supporting member 113 to the frame body 11.

The sliding rail 30 is formed for example of a fixed rail 32 having a U-shaped cross-section and a moving rail 31 movable within the fixed rail, further having a roller bearing 33 etc. disposed between the fixed rail 32 and the moving rail 31 so as to facilitate movement.

According to such arrangement, upon mounting and fixing an electronic equipment to the body 5, the operator disposes the power unit 11 mounted on a lifter (not shown) in front of the electronic equipment insertion opening 52 with the cover 59 opened, pulls out the moving rail 31 of the sliding rail 30, and attaches a fixing member to the end of the second sliding rail supporting member 113 fixed to the moving rail 31 and fixes the same by a locking tool (not shown). At this time, the lower surface of the support member 112 of the power unit 11 is positioned on the upper surface of the second sliding rail support member 113, and the power unit 11 is fixed to the second sliding rail support member 113.

Thereafter, the operator pushes the power unit 11 into the underfloor storage portion 51 so that the electronic equipment-side connector 115 is connected to the body-side connector to complete electric connection, and positions the unit to the fixed position. Thereafter, the operator locks the fixing member 117 to the electronic equipment fixing member 58 by a locking tool (not shown), thereby fixing the power unit 11 to the determined position. At this time, the cooling fin 114 of the power unit 11 is exposed through the cooling opening 53 to the cooling space air. Then, the operator closes the electronic equipment insertion opening 52 with a cover 59, and completes the mounting operation of the power unit to the body.

Thus, according to the present invention, the power unit 11 can be mounted to the rolling stock body 5 extremely easily without any need of an electrical connecting operation or a mounting operation of an electric device storage box to the body.

Similarly, when removing the power unit from the rolling stock body, the operator simply opens the cover 59, releases the lock that fixes the fixing member 117 to the electronic equipment fixing means 58, pulls the power unit 11 out of the underfloor storage portion 51 onto a lifter (not shown), and releases the fixing member 118 from the second sliding rail support member 113, thereby removing the power unit 11.

Thus, the operation for removing the power unit 11 from the rolling stock body 5 is facilitated, without having to disconnect the electric connections or to remove an electronic equipment storage box from the body.

Figure 4:
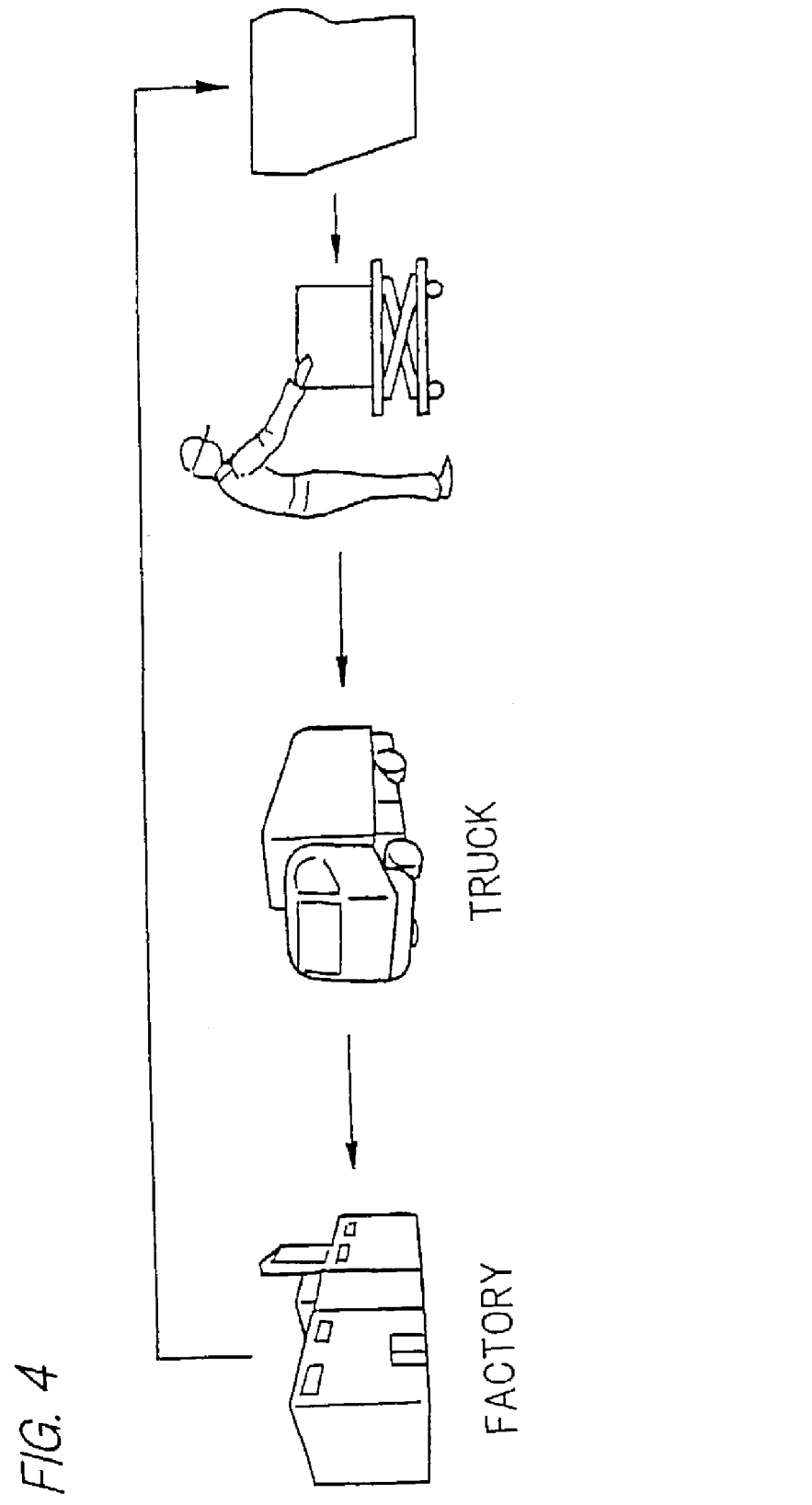
FIG. 4 is an explanatory view showing the flow of maintenance operation of the underfloor electronic equipment according to the mounting method of the present invention.

As shown in FIG. 4, the removed power unit 11 is rested on a lifter, then mounted on a truck etc. to be transferred to an inspection/maintenance factory, where it goes through predetermined maintenance and inspection procedures before being remounted to the rolling stock body.

Figure 5:
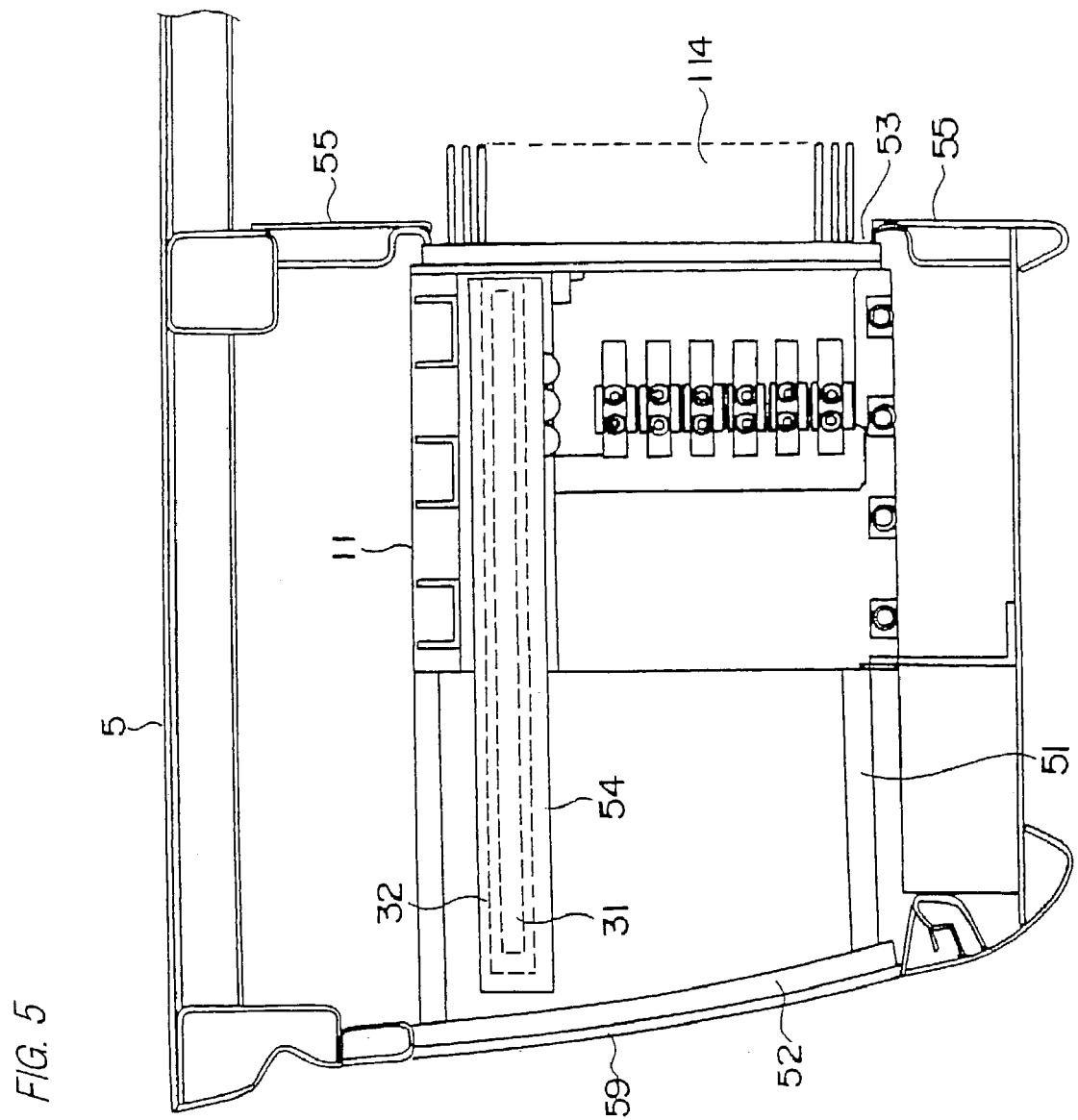
FIG. 5 is a cross-sectional view explaining the outline of the method for mounting the underfloor electronic equipment to a rolling stock body according to the second embodiment of the present invention.
Figure 6:
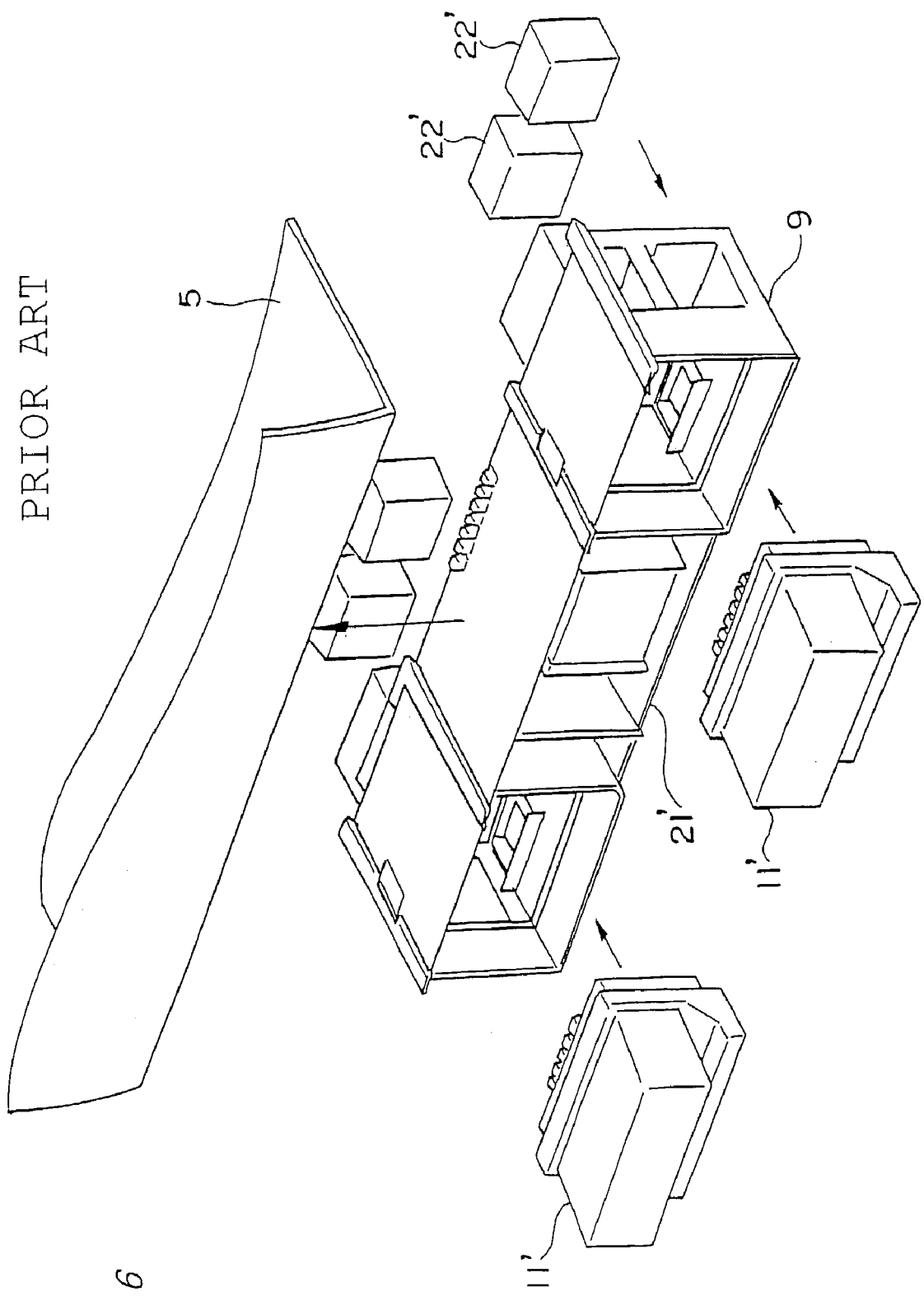
FIG. 6 is a perspective view explaining the method for mounting the underfloor electronic equipment to a rolling stock body according to the prior art.

FIG. 5 is used to explain another embodiment of the present invention. According to this embodiment, the frame body 11 of the power unit 11 is lengthened to reach the electronic equipment insertion opening 52 of the underfloor storage portion 51, and to the outer end is mounted a cover 59. Based on such construction, the operator can insert the power unit to the fixed portion of the underfloor storage portion 51 and fix the power unit to the opening 52 using a locking tool (not shown) provided on the cover 59, thereby mounting the power unit 11 securely to the body 5.

In the above explanation, the underfloor electronic equipment is a semiconductor device, actually a power unit of an inverter, but the underfloor electronic equipment can be other electronic devices such as a filter capacitor, a control unit, an auxiliary inverter unit, an SIV (static inverter) module, and so on.

Moreover, according to the above explanation, the cooling means in the space formed to the center of the underfloor can be either natural air cooling or forced air cooling by running wind, but it is also possible to mount a fan to the space to forcedly circulate the cooling wind.

According to the present invention, the following effects can be achieved.

The operation for removing the power unit (electronic equipment) from the rolling stock for maintenance is simplified, and the lead time required for the maintenance/replacement operation is shortened.

It is no longer required to isolate the appliances that need to be dustproof with a separation plate from those that require no dustproof environment, so the cost related thereto is cut down.

The operation for connecting the wires of the main circuit wiring to the electronic equipment is simplified, and the cost related to forming the whole body is cut down.

The arrangement of the electronic equipment can be designed appropriately by considering the influence of dust and water, thereby reducing the failure rate. In contrast to the prior art method where the electronic equipments have to be stored within a determined sized area and forcedly air-cooled by a blower, the present invention enables the electronic equipment to be located at the most appropriate area under the floor of the rolling stock body and cooled naturally, omitting the need of a blower. Moreover, failures caused by electric discharges can also be reduced.

According to the present invention, a large storage space can be taken within a sealed area, and electronic equipment can be arranged considering the heat caused thereby, so failures caused by heat can also be reduced.

What is claimed is:

1. A system for mounting an underfloor electronic equipment to a rolling stock body having an underfloor storage portion formed in a longitudinal direction of an underfloor of the rolling stock body as a portion of the body, the underfloor storage portion comprising:

an electronic equipment insertion opening through which the electronic equipment can pass formed to an outer side of the body, and a cover for covering the electronic equipment insertion opening that is provided so that it can be either attached and detached or opened and closed, wherein the cover for covering the electronic equipment insertion opening when fixing the electronic equipment to the fixed position within the underfloor storage unit is mounted integrally to the electronic equipment, and the electronic equipment is immovably fixed to the fixed position within the underfloor storage portion by fixing the cover;

a guidance tool for carrying out guidance and support of the underfloor electronic equipment formed as a unit;

a body-side connector corresponding to an electronic equipment-side connector equipped to the underfloor electronic equipment; and a fixing tool for fixing the underfloor electronic equipment to the underfloor storage portion;

the underfloor electronic equipment comprising:

a moving means guided by the guidance tool provided to the underfloor storage portion; and the electronic equipment-side connector corresponding to the body-side connector;

the underfloor electronic equipment capable of being moved by the guidance tool between a fixed position within the underfloor storage portion and a removal position outside the underfloor storage portion, the equipment being stored and fixed to the fixed position within the underfloor storage portion by a fixing means, the electronic equipment-side connector and the body-side connector being connected when the underfloor electronic equipment is at the fixed position.

2. A system for mounting an underfloor electronic equipment to a rolling stock body according to claim 1, wherein the body-side connector is located so that the electronic equipment-side connector is connected to the body-side connector when the electronic equipment is fixed to the fixed position within the underfloor storage portion.

3. A system for mounting an underfloor electronic equipment to a rolling stock body according to claim 1, arranged so that when the electronic equipment is fixed to the fixed position of the underfloor storage portion the electronic equipment-side connector is connected to the body-side connector, wherein the body-side connector is formed as an integral structure with a plurality of other body-side connectors that connect to a plurality of electronic equipments, the body-side connector disposed so that it can be removed from one side of the underfloor storage portion.

4. A rolling stock to which is applied a system for mounting an underfloor electronic equipment to a rolling stock body with an underfloor storage portion formed under a floor in a longitudinal direction of the rolling stock body as a portion of the body; according to the mounting system, the underfloor storage portion comprising a guidance tool for guiding and supporting the underfloor electronic equipment formed as a unit, a body-side connector corresponding to an electronic equipment-side connector provided to the underfloor electronic equipment and a fixing tool for fixing the underfloor electronic equipment to the underfloor storage portion; the underfloor electronic equipment comprising a moving means guided by a guidance tool provided to the underfloor storage portion and an electronic equipment-side connector corresponding to the body-side connector, the underfloor electronic equipment being moved between a fixed position of the underfloor storage portion and a removal position outside the underfloor storage portion by the guidance tool, the underfloor electronic equipment being stored and fixed by the fixing tool to the fixed position within the underfloor storage portion, the electronic equipment-side connector being connected to the body-side connector at the fixed position;

the underfloor storage portion being formed under a floor in the longitudinal direction of the rolling stock body as a portion of the body, comprising the guidance tool for guiding and supporting the underfloor electronic equipment formed as a unit;

the body-side connector corresponding to the electronic equipment-side connector provided to the underfloor electronic equipment;

the fixing means for fixing the underfloor electronic equipment to the underfloor storage portion;

an electronic equipment insertion opening formed to the outer surface of the body through which the electronic equipment can pass; and an opening formed to a side surface facing a center of the body through which a portion of the electronic equipment is exposed.

5. A system for mounting an underfloor electronic equipment to a rolling stock body having an underfloor storage portion formed in a longitudinal direction of an underfloor of the rolling stock body as a portion of the body, the underfloor storage portion comprising:

a guidance tool for carrying out guidance and support of the underfloor electronic equipment formed as a unit;

a body-side connector corresponding to an electronic equipment-side connector equipped to the underfloor electronic equipment; and a fixing tool for fixing the underfloor electronic equipment to the underfloor storage portion, wherein the underfloor storage portion comprises a cooling opening formed to a side facing a center of the body through which is exposed a portion of the electronic equipment;

the underfloor electronic equipment comprising:

a moving means guided by the guidance tool provided to the underfloor storage portion; and the electronic equipment-side connector corresponding to the body-side connector;

the underfloor electronic equipment capable of being moved by the guidance tool between a fixed position within the underfloor storage portion and a removal position outside the underfloor storage portion, the equipment being stored and fixed to the fixed position within the underfloor storage portion by a fixing means, the electronic equipment-side connector and the body-side connector being connected when the underfloor electronic equipment is at the fixed position.

6. A system for mounting an underfloor electronic equipment to a rolling stock body having an underfloor storage portion formed in a longitudinal direction of an underfloor of the rolling stock body as a portion of the body, the underfloor storage portion comprising:

a guidance tool for carrying out guidance and support of the underfloor electronic equipment formed as a unit;

a body-side connector corresponding to an electronic equipment-side connector equipped to the underfloor electronic equipment; and a fixing tool for fixing the underfloor electronic equipment to the underfloor storage portion;

the underfloor electronic equipment comprising:

a moving means guided by the guidance tool provided to the underfloor storage portion; and the electronic equipment-side connector corresponding to the body-side connector;

the underfloor electronic equipment capable of being moved by the guidance tool between a fixed position within the underfloor storage portion and a removal position outside the underfloor storage portion, the equipment being stored and fixed to the fixed position within the underfloor storage portion by a fixing means, the electronic equipment-side connector and the body-side connector being connected when the underfloor electronic equipment is at the fixed position, wherein the guidance tool provided to the underfloor storage portion and the moving means provided to the electronic equipment are composed of sliding rails.

7. A system for mounting an underfloor electronic equipment to a rolling stock body having an underfloor storage portion formed in a longitudinal direction of an underfloor of the rolling stock body as a portion of the body, the underfloor storage portion comprising:

a guidance tool for carrying out guidance and support of the underfloor electronic equipment formed as a unit;

a body-side connector corresponding to an electronic equipment-side connector equipped to the underfloor electronic equipment; and a fixing tool for fixing the underfloor electronic equipment to the underfloor storage portion;

the underfloor electronic equipment comprising:

a moving means guided by the guidance tool provided to the underfloor storage portion; and the electronic equipment-side connector corresponding to the body-side connector;

the underfloor electronic equipment capable of being moved by the guidance tool between a fixed position within the underfloor storage portion and a removal position outside the underfloor storage portion, the equipment being stored and fixed to the fixed position within the underfloor storage portion by a fixing means, the electronic equipment-side connector and the body-side connector being connected when the underfloor electronic equipment is at the fixed position, wherein the guidance tool formed to the underfloor storage portion is a support rail formed to the interior of the underfloor storage portion, and the moving means provided to the electronic equipment are wheels guided by the support rail.

8. A system for mounting an underfloor electronic equipment to a rolling stock body having an underfloor storage portion formed in a longitudinal direction of an underfloor of the rolling stock body as a portion of the body, the underfloor storage portion comprising:

a guidance tool for carrying out guidance and support of the underfloor electronic equipment formed as a unit;

a body-side connector corresponding to an electronic equipment-side connector equipped to the underfloor electronic equipment; and a fixing tool for fixing the underfloor electronic equipment to the underfloor storage portion;

the underfloor electronic equipment comprising:

a moving means guided by the guidance tool provided to the underfloor storage portion; and the electronic equipment-side connector corresponding to the body-side connector, wherein the underfloor electronic equipment is a semiconductor device;

the underfloor electronic equipment capable of being moved by the guidance tool between a fixed position within the underfloor storage portion and a removal position outside the underfloor storage portion, the equipment being stored and fixed to the fixed position within the underfloor storage portion by a fixing means, the electronic equipment-side connector and the body-side connector being connected when the underfloor electronic equipment is at the fixed position.

9. A system for mounting an underfloor electronic equipment to a rolling stock body according to claim 8, wherein the semiconductor device is a power unit of an inverter unit.

* * * * *